US007569913B2

(12) United States Patent
Enicks (10) Patent No.: US 7,569,913 B2
(45) Date of Patent: Aug. 4, 2009

(54) BORON ETCH-STOP LAYER AND METHODS RELATED THERETO

(75) Inventor: Darwin G. Enicks, Colorado Springs, CO (US)

(73) Assignee: Atmel Corporation, San Jose, CA (US)

(*) Notice: Subject to any disclaimer, the term of this patent is extended or adjusted under 35 U.S.C. 154(b) by 0 days.

(21) Appl. No.: 11/553,313

(22) Filed: Oct. 26, 2006

(65) Prior Publication Data

US 2008/0099840 A1    May 1, 2008

(51) Int. Cl.
   *H01L 21/308* (2006.01)
(52) U.S. Cl. .................. 257/613; 257/616; 257/655; 257/E21.232; 438/758; 438/740; 438/752
(58) Field of Classification Search .......... 257/613, 257/616, 655, E21.232; 438/758, 740, 752
   See application file for complete search history.

(56) References Cited

U.S. PATENT DOCUMENTS

| | | | |
|---|---|---|---|
| 4,652,183 | A | 3/1987 | Veltri et al. |
| 5,155,571 | A | 10/1992 | Wang et al. |
| 5,378,901 | A | 1/1995 | Nii |
| 5,466,949 | A | 11/1995 | Okuno |
| 5,569,538 | A * | 10/1996 | Cho ..................... 428/427 |
| 5,906,708 | A | 5/1999 | Robinson et al. |
| 5,965,931 | A | 10/1999 | Wang et al. |
| 6,064,081 | A | 5/2000 | Robinson et al. |
| 6,165,891 | A | 12/2000 | Chooi et al. |
| 6,323,108 | B1 | 11/2001 | Kub et al. |
| 6,399,970 | B2 | 6/2002 | Kubo et al. |
| 6,512,252 | B1 | 1/2003 | Takagi et al. |
| 6,531,369 | B1 | 3/2003 | Ozkan et al. |
| 6,552,375 | B2 | 4/2003 | Swanson et al. |
| 6,656,809 | B2 | 12/2003 | Greenberg et al. |
| 6,670,542 | B2 * | 12/2003 | Sakata et al. ............. 136/258 |
| 6,680,494 | B2 | 1/2004 | Gutierrez-Aitken et al. |
| 6,744,079 | B2 | 6/2004 | Jagannathan et al. |
| 6,750,484 | B2 | 6/2004 | Lippert et al. |
| 6,759,694 | B1 | 7/2004 | Hsu et al. |

(Continued)

FOREIGN PATENT DOCUMENTS

WO    WO-2007/001672 A3    1/2007

(Continued)

OTHER PUBLICATIONS

Darwin Enicks, "Pseudormorphic Growth of Sub-40 nm Si1-x-yGexCy by LPCVD with Enhanced Boron Confinement and Carrier Transport for Advanced NPN HBTs", White Paper from Atmel Corporation, Aug. 2006, 11 pages.

(Continued)

*Primary Examiner*—Victor A Mandala
(74) *Attorney, Agent, or Firm*—Schwegman, Lundberg & Woessner P.A.

(57) ABSTRACT

A method for forming an etch-stop layer and a resulting structure fabricated therefrom. The etch-stop layer has a semiconductor layer having a first surface and a boron layer formed below the first surface of the semiconductor layer. The boron layer has a full-width half-maximum (FWHM) thickness value of less than 100 nanometers. The boron layer is formed by a chemical vapor deposition (CVD) system.

17 Claims, 6 Drawing Sheets

U.S. PATENT DOCUMENTS

| | | | |
|---|---|---|---|
| 6,855,963 | B1 | 2/2005 | Chu et al. |
| 6,906,400 | B2 | 6/2005 | Delhougne et al. |
| 6,927,140 | B2 | 8/2005 | Soman et al. |
| 6,936,910 | B2 | 8/2005 | Ellis-Monaghan et al. |
| 6,963,089 | B2 | 11/2005 | Shi et al. |
| 6,995,430 | B2 | 2/2006 | Langdo et al. |
| 7,074,623 | B2 | 7/2006 | Lochtefeld et al. |
| 7,091,114 | B2 * | 8/2006 | Ito et al. ............ 438/527 |
| 7,495,250 | B2 | 2/2009 | Enicks |
| 2002/0081861 | A1 | 6/2002 | Robinson et al. |
| 2002/0105015 | A1 | 8/2002 | Kubo et al. |
| 2003/0040130 | A1* | 2/2003 | Mayur et al. ............ 438/14 |
| 2003/0080394 | A1 | 5/2003 | Babcock et al. |
| 2003/0082882 | A1 | 5/2003 | Babcock et al. |
| 2003/0132453 | A1 | 7/2003 | Greenberg et al. |
| 2003/0146448 | A1 | 8/2003 | U'Ren et al. |
| 2004/0009649 | A1 | 1/2004 | Kub et al. |
| 2004/0031979 | A1 | 2/2004 | Lochtefeld et al. |
| 2004/0063293 | A1 | 4/2004 | Greenberg et al. |
| 2004/0079989 | A1 | 4/2004 | Kaneko et al. |
| 2004/0164336 | A1 | 8/2004 | Weimer et al. |
| 2004/0222486 | A1 | 11/2004 | Ellis-Monaghan et al. |
| 2005/0045905 | A1 | 3/2005 | Chu et al. |
| 2005/0051861 | A1 | 3/2005 | Shi et al. |
| 2005/0112857 | A1 | 5/2005 | Gluschenkov et al. |
| 2005/0127392 | A1 | 6/2005 | Chu et al. |
| 2005/0181555 | A1 | 8/2005 | Haukka et al. |
| 2005/0191911 | A1 | 9/2005 | Greenberg et al. |
| 2005/0230705 | A1 | 10/2005 | Taylor |
| 2005/0280103 | A1 | 12/2005 | Langdo et al. |
| 2006/0030093 | A1 | 2/2006 | Zhang et al. |
| 2006/0068557 | A1 | 3/2006 | Ochimizu et al. |
| 2006/0186510 | A1 | 8/2006 | Lochtefeld et al. |
| 2006/0231862 | A1 | 10/2006 | Otsuka et al. |
| 2006/0273392 | A1* | 12/2006 | Ito et al. ............ 257/335 |
| 2006/0284165 | A1 | 12/2006 | Berger et al. |
| 2006/0292809 | A1 | 12/2006 | Enicks et al. |
| 2007/0054460 | A1* | 3/2007 | Enicks ............ 438/312 |
| 2007/0096142 | A1 | 5/2007 | Tachibana et al. |
| 2007/0105335 | A1 | 5/2007 | Fitzgerald |
| 2007/0290193 | A1 | 12/2007 | Tucker |
| 2008/0050883 | A1 | 2/2008 | Enicks |
| 2008/0099840 | A1 | 5/2008 | Enicks |
| 2008/0099882 | A1 | 5/2008 | Enicks |
| 2008/0237716 | A1 | 10/2008 | Enicks et al. |

FOREIGN PATENT DOCUMENTS

| | | | |
|---|---|---|---|
| WO | WO-2007001672 | A2 | 1/2007 |
| WO | WO-2008/024587 | A3 | 2/2008 |
| WO | WO-2008024587 | A2 | 2/2008 |
| WO | WO-2008054957 | A1 | 5/2008 |
| WO | WO-2008057692 | A2 | 5/2008 |
| WO | WO-2008057692 | A3 | 5/2008 |
| WO | WO-2008057695 | A1 | 5/2008 |

OTHER PUBLICATIONS

Prof. Ulrich Gösele et al., Science and Technology of Semiconductor Wafer Bonding, Duke Univ., Chap. 7, Wafer Bonding Laboratory, Thinning Procedures [online]. Undated [retrieved Aug. 24, 2006]. Retrieved from the Internet: < URL: www.duke.edu/web/wbl/ch7 >.

D. Enicks et al., "Thermal Redistribution of Oxygen and Carbon in Sub-50 NM Strained Layers of Boron Doped SiGeC", ECS Transactions, 3 (7), 2006, pp. 1087-1098.

"U.S. Appl. No. 11/467,480 Non-Final Office Action mailed Feb. 21, 2008.", 3 pgs.

Kar, G. S., et al., "Effect of carbon on lattice strain and hole mobility in Si1-xGex alloys", *Journal of Materials Science: Materials in Electronics*, 13(1), (Jan. 2002), 49-55.

"U.S. Appl. No. 11/166,287 Non-Final Office Action mailed Apr. 3, 2007", 11 Pgs.

"U.S. Appl. No. 11/553,333 Non-Final Office Action mailed Apr. 3, 2008", 7 pgs.

Gosele, U. , et al., "Chapter 7 Thinning Procedures", *Science and Technology of Semiconductor Wafer Bonding, Duke University*, http://www.duke.edu/web/wbl/ch7/ch7-hpge.html#7.1, (1999), 14 pgs.

"U.S. Appl. No. 11/166,287 Response filed Jun. 30, 2008 to Non-Final Office Action mailed Apr. 13, 2008", 16 pages.

"U.S. Appl. No. 11/166,287, Response filed Jan. 23, 2008 to Restriction Requirement mailed Jan. 16, 2008", 1 pg.

"U.S. Appl. No. 11/166,287, Restriction Requirement mailed Jan. 16, 2008", 5 pgs.

"U.S. Appl. No. 11/467,480, Response filed Jan. 21, 2008 to Restriction Requirement mailed Jan. 8, 2008", 1 pg.

"U.S. Appl. No. 11/467,480, Restriction Requirement mailed Jan. 8, 2008", 6 pgs.

"U.S. Appl. No. 11/467,480 Final Office Action mailed Aug. 20, 2008", 9 pgs.

"U.S. Appl. No. 11/467,480 Response filed May 21, 2008 to Non-Final Office Action mailed Feb. 21, 2008", 18 pgs.

"U.S. Appl. No. 11/553,333, Amendment and Response filed Jun. 30, 2008 to Non-Final Office Action mailed Apr. 3, 2008", 13 pgs.

"U.S. Appl. No. 11/554,430, Response and Preliminary Amendment filed Apr. 11, 2008 to Restriction Requirement mailed Mar. 13, 2008", 9 pgs.

"U.S. Appl. No. 11/554,430, Restriction Requirement mailed Mar. 13, 2008", 6 pgs.

"U.S. Appl. No. 11/467,480 Final Office Action Mailing Date: Aug. 20, 2008", 11 Pgs.

"International Application No. PCT/US07/80723, Interntional Search Report mailed Mar. 6, 2008", 2 pgs.

"International Application No. PCT/US07/80723, Written Opinion mailed Mar. 6, 2008", 5 pgs.

"International Application No. PCT/US07/80830 International Search Report mailed Mar. 6, 2008", 2 pgs.

"International Application No. PCT/US07/80830 Written Opinion mailed Mar. 6, 2008", 4 pgs.

"International Application No. PCT/US2007/074232, International Search Report mailed Jun. 18, 2008", 2 pgs.

"International Application No. PCT/US2007/074232, Written Opinion mailed Jun. 18, 2008", 5 pgs.

"U.S. Appl. No. 11/166,287, Non-Final Office Action mailed Nov. 4. 2008", 13 pgs.

"U.S. Appl. No. 11/467,480 Response filed Dec. 19. 2008 to Final Office Action mailed Aug. 20, 2008", 22 pgs.

"U.S. Appl. No. 11/554,430, Non-Final Office Action mailed Sep. 30, 2008", 11 pgs.

"U.S. Appl. No. 12/114,571, Non-Final Office Action mailed Nov. 5, 2008", 13 pgs.

"U.S. Appl. No. 11/553,333, Notice of Allowance mailed Sep. 8, 2008", 5 pgs.

Kasper, E., et al., *Properties of Silicon Germanium and SiGe: Carbon*, EMIS Datareviews Series No. 24, INSPEC, The Institute of Electrical Engineers, London, United Kingdom, (2000), 358 pages.

"U.S. Appl. No. 11/166,287, Response filed Feb. 3, 2009 to Non-Final Office Action mailed Nov. 4, 2008", 20 pages.

"U.S. Appl. No. 11/467,480, Notice of Allowance mailed Mar. 9, 2009", 4 pgs.

"U.S. Appl. No. 11/553,333, Notice of Allowance mailed Jan. 2, 2009", 5 pgs.

"U.S. Appl. No. 11/554,430, Response filed Dec. 30, 2008 to Non Final Office Action mailed Sep. 30, 2009", 15 pgs.

"U.S. Appl. No. 12/114,571, Notice of Allowance mailed Apr. 24. 2009", 8 pgs.

"U.S. Appl. No. 11/166,287, Final Office Action mailed Jun. 1, 2009", 13 pgs.

"U.S. Appl. No. 12/114,571, Amendment and Response filed Feb. 5, 2009 to Non-Final Office Action mailed Nov. 5, 2008", 13 pgs.

* cited by examiner

BORON ETCH-STOP LAYER AND METHODS RELATED THERETO

TECHNICAL FIELD

The invention relates generally to methods of fabrication of integrated circuits (ICs). More particularly, the invention is a method of fabricating a highly selective boron etch-stop in ICs in which the etch-stop has little diffusion into surrounding semiconductor layers even when subjected to elevated temperatures.

BACKGROUND ART

Several material systems have emerged as key facilitators to extend Moore's lay well into the next decade. These key facilitators include (1) silicon-on-insulator (SOI), (2) silicon-germanium (SiGe), and (3) strained silicon. With reference to SOI and related technologies, there are numerous advantages associated with an insulating substrate. These advantages include reduced parasitic capacitances, improved electrical isolation, and reduced short-channel effects. Advantages of SOI can be combined with energy bandgap and carrier mobility improvements offers by $Si_{1-x}Ge_x$ and strained silicon devices.

SOI substrates generally include a thin layer of silicon on top of an insulator. Integrated circuit components are formed in and on the thin layer of silicon. The insulator can be comprises of insulators such as silicon dioxide ($SiO_2$), sapphire, or various other insulative materials.

Currently, several techniques are available to fabricate SOI substrates. One technique for fabricating SOI substrates is separation by implantation of oxygen (SIMOX). In a SIMOX process, oxygen is implanted below a surface of a silicon wafer. A subsequent anneal step produces a buried silicon dioxide layer with a silicon overlayer. However, the time required for an implantation in a SIMOX process can be extensive and, consequently, cost prohibitive. Moreover, an SOI substrate formed by SIMOX may be exposed to high surface damage and contamination.

Figure 1A:
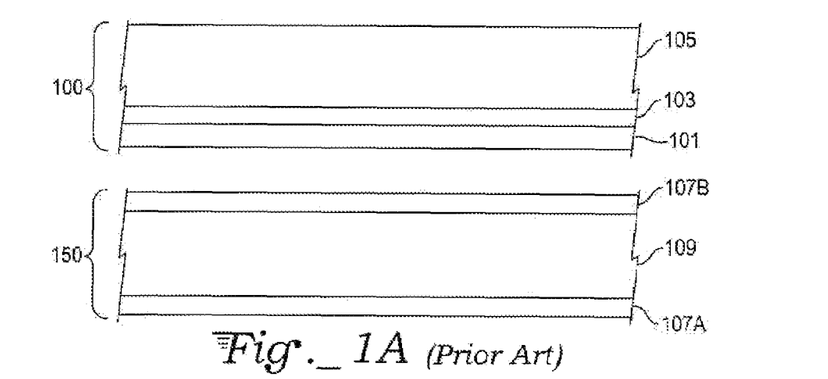
FIGS. 1A-1D are cross-sectional views of a prior art bond and etch back silicon on insulator (BESOI) fabrication technique.

Another technique is bond-and-etch-back SOI (BESOI), where an oxidized wafer is diffusion-bonded to a non-oxidized wafer. With reference to FIG. 1A, a silicon device wafer 100 and a silicon handle wafer 150 comprise major components for forming a BESOI wafer. The silicon device wafer 100 includes a first silicon layer 101, which will serve as a device layer, an etch-stop layer 103, and a second silicon layer 105. The etch-stop layer 103 is frequently comprised of boron. The silicon handle wafer 150 includes a lower silicon dioxide layer 107A, a silicon substrate layer 109, and an upper silicon dioxide layer 107B. The lower 107A and upper 107B silicon dioxide layers are frequently thermally grown oxides formed concurrently.

Figure 1B:
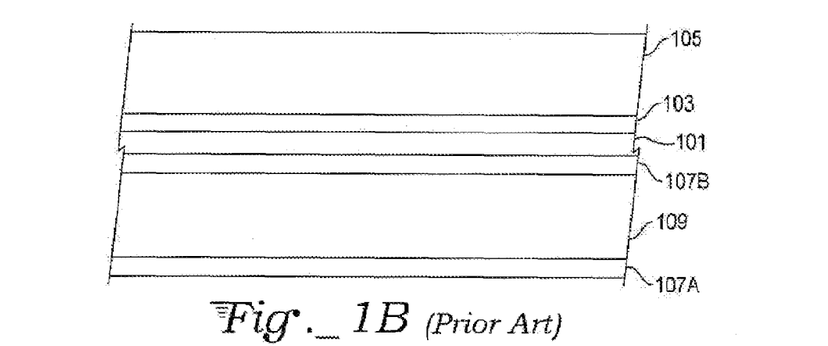
Figure 1C:
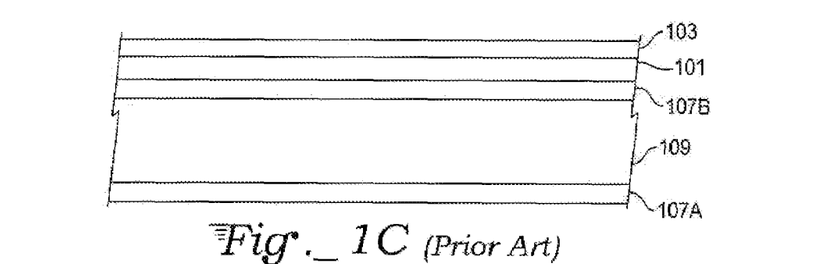

In FIG. 1B, the silicon device wafer 100 and the silicon handle wafer 150 are brought into physical contact and bonded, one to the other. The initial bonding process is followed by a thermal anneal, thus strengthening the bond. The silicon device wafer 100 in the bonded pair is thinned. Initially, most of the second silicon layer 105 is removed by mechanical grinding and polishing until only a few tens of micrometers (i.e., "microns" or μm) remains. A high-selectivity wet or dry chemical etch removes remaining portions of the second silicon layer 105, stopping on the etch-stop layer 103. (Selectivity is discussed in detail, below.) An end-result of the second silicon layer 105 etch process is depicted in FIG. 1C.

Figure 1D:
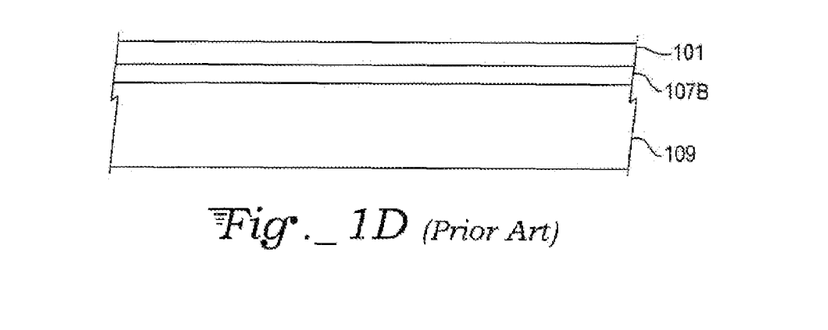

During the etching process the silicon handle wafer 150 is protected by a coated mask layer (not shown). In FIG. 1D, the etch-stop layer 103 has been removed using another high-selectivity etchant. As a result of these processes, the first silicon layer 101, serving as a device layer, is transferred to the silicon handle wafer 150. A backside of the silicon substrate layer 109 is ground, polished, and etched to achieve a desired overall thickness.

To ensure BESOI substrates are thin enough for subsequent fabrication steps, as well as meeting contemporary demands for ever-decreasing physical size and weight constraints, BESOI requires the presence of the etch-stop layer 103 during the layer transfer process. Currently, two main layer transfer technologies exist: 1) selective chemical etching (as discussed above), and 2) splitting of a hydrogen-implanted layer from a device layer (a hydrogen implantation and separation process). Both technologies meet requirements of advanced semiconductor processing.

In the hydrogen implantation and separation process, hydrogen ($H_2$) is implanted into silicon having a thermally grown silicon dioxide layer. The implanted $H_2$ embrittles of the silicon substrate underlying the silicon dioxide layer. The $H_2$ implanted wafer may be bonded with a second silicon wafer having a silicon dioxide overlayer. The bonded wafer may be cut across the wafer at a peak location of the hydrogen implant by appropriate annealing.

The BESOI process described is relatively free from ion implant damage inherent in the SIMOX process. However, the BESOI process requires a time consuming sequence of grinding, polishing, and chemical etching.

Contemporary Etch-Stops

As described above, the BESOI process is a manufacturing-oriented technique to build silicon on insulator substrates and is partially dependent upon chemical etching.

Etch-stop performance is described by a mean etch selectivity, S, which defines an etch rate ratio of silicon to the etch-stop layer $$S = \frac{R_{Si}}{R_{es}}$$

where $R_{Si}$ is an etch rate of silicon and $R_{es}$ is an etch rate of the etch-stop. Therefore, a selectivity value where S=1 relates to a case of no etch selectivity.

Figure 2A:
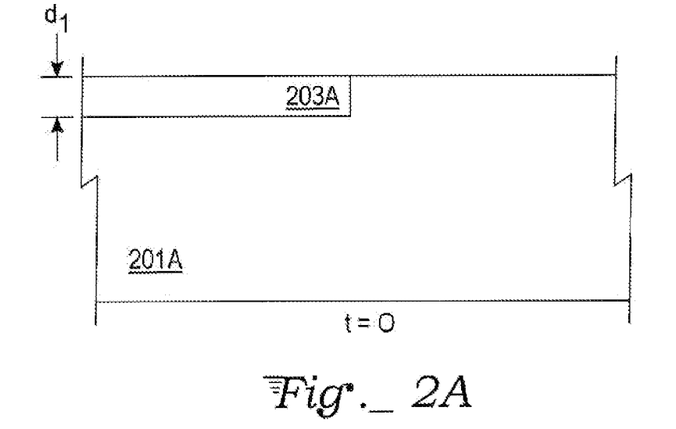
FIGS. 2A-2C are cross-sectional views indicating a method to determine etch-stop efficiency.
Figure 2B:
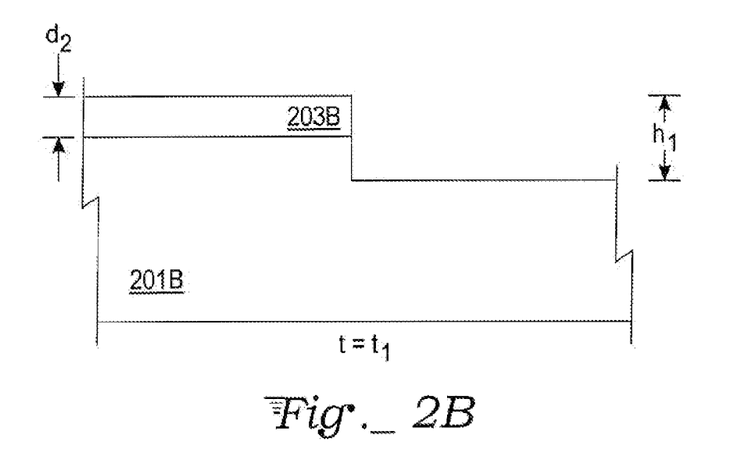
Figure 2C:
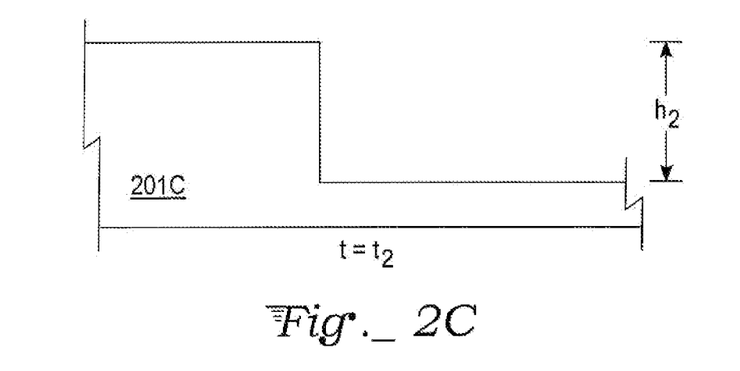

One method to evaluate etch-stop efficiency is to measure a maximum etch step height across an etch-stop and non-etch-stop boundary. In FIG. 2A, an etch-stop 203A is formed by ion implantation into a portion of a silicon substrate 201A. The etch-stop 203A has a thickness $d_1$ at time t=0 (i.e., prior to application of any etchant). At time $t=t_1$ (FIG. 2B) a partially etched silicon substrate 201B is etched to a depth $h_1$. The etch-stop 203A is now a partially etched etch-stop 203B. The partially etched etch-stop 203B is etched to a thickness of $d_2$. At time $t=t_2$ (FIG. 2C), the partially etched etch-stop 203B has been completely etched and a fully etched silicon substrate 201C achieves a maximum etch step height of $h_2$. An etch rate of the etch-stop 203A (FIG. 2A) is partially dependent upon both an implanted dopant material as well as an implant profile of the dopant employed. From a practical point of view, the maximum etch step is critical since it determines an acceptable thickness variation of the device wafer after grinding and polishing prior to etch back in the BESOI process.

For example, if a maximum etch step is 3 units, the allowable thickness non-uniformity of the device wafer after the usual mechanical thinning procedure should be less than 1.5 units. The mean etch selectivity, S, can be derived from the effective etch-stop layer thickness $d_1$ and the maximum etch step $h_2$ as $$S = \frac{\frac{d_1 + h_2}{t}}{\frac{d_1}{t}}$$

$$\Downarrow$$

$$S = 1 + \frac{h_2}{d_1}$$

where t is the etch time required to reach the maximum etch step height $h_2$. In the prior example, $t_2$ is the etch time required to reach the maximum etch step height $h_2$.

Figure 3:
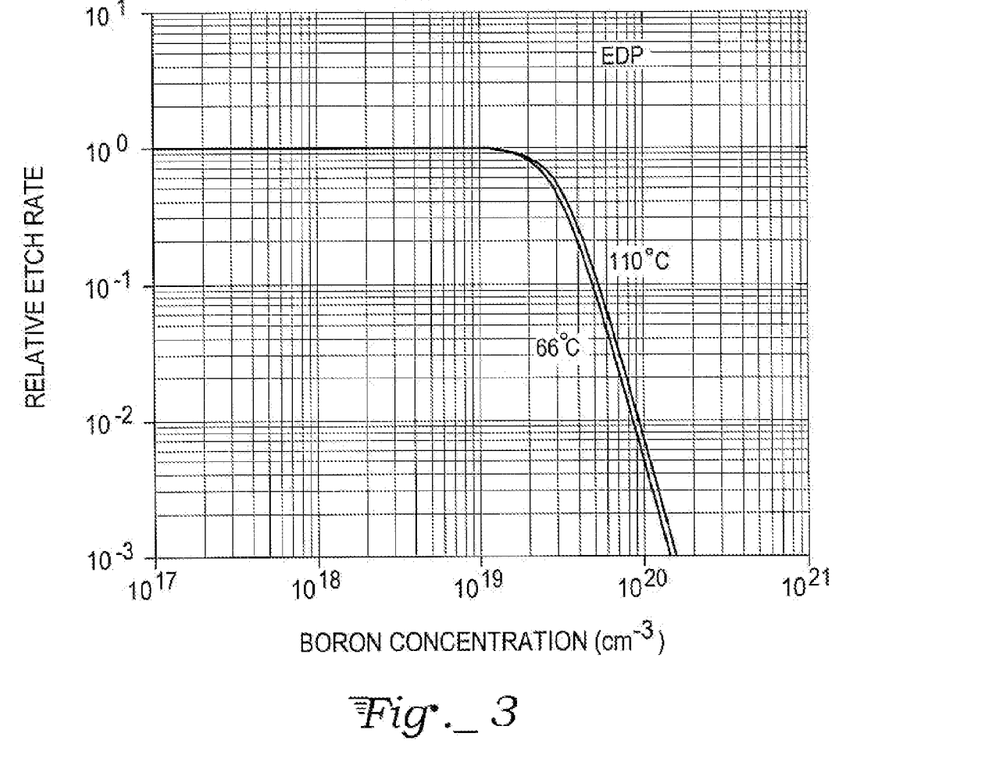
FIG. 3 is a graph indicating relative etch rates for an ethylenediamine-pyrocatechol (EDP) wet-chemical etchant as a function of boron concentration contained within a silicon (100) substrate at different annealing temperatures.

Aqueous alkaline solutions are commonly used anisotropic silicon etchants. Two categories of aqueous alkaline solutions employed are: (1) pure inorganic aqueous alkaline solutions such as potassium hydroxide (KOH), sodium hydroxide (NaOH), cesium hydroxide (CsOH), and ammonium hydroxide ($NH_4OH$); and (2) organic alkaline aqueous solutions such as ethylenediamine-pyrocatechol-water (aqueous EDP), tetramethyl ammonium hydroxide (TMAH) or ($CH_3$)$_4$NOH)), and hydrazine ($H_4N_2$). Silicon etch rates of all aqueous alkaline etchants are reduced significantly if silicon is doped with boron in concentrations exceeding $2 \times 10^{19}$ cm$^{-3}$. FIG. 3 graphically indicates a rapid falloff in relative etch rate as a function of boron concentration using EDP as an etchant.

However, problems arise with using boron as an etch-stop. A skilled artisan recognizes that boron diffuses readily in pure silicon. Therefore, any etch non-uniformity is increasingly an issue as device design rules continue to decline. A boron etch-stop layer of the prior art is frequently hundreds of nanometers in width (at full-width half-maximum (FWHM)). Therefore, what is needed is an extremely thin and robust etch-stop layer having a high etchant selectivity in comparison with silicon.

SUMMARY

In an exemplary embodiment, the present invention is an etch-stop layer having a semiconductor layer having a first surface and a boron layer formed below the first surface of the semiconductor layer. The boron layer has a full-width half-maximum (FWHM) thickness value of less than 100 nanometers. The boron layer is formed by a chemical vapor deposition (CVD) system.

In another exemplary embodiment, the present invention is a method to fabricate an etch-stop. The method includes flowing a carrier gas over a substrate in a chemical vapor deposition chamber, flowing a silicon precursor gas over the substrate in the deposition chamber and flowing a boron precursor gas over the substrate in the deposition chamber. The boron precursor gas forms a boron layer to act as the etch-stop and forms below a first surface of the substrate. The boron layer is less than 100 nanometers in thickness when measured as a full-width half-maximum (FWHM) value.

In another exemplary embodiment, the present invention is a method to form an electronic device. The method includes flowing a boron precursor gas over a substrate in a chemical vapor deposition chamber such that the boron precursor gas forms a boron layer thereby acting as an etch-stop layer. The etch-stop layer is formed below a first surface of the substrate and is less than 100 nanometers in thickness when measured as a full-width half-maximum (FWHM) value. One or more dielectric spacers are formed on a surface of the substrate to provide a self-aligning structure. The one or more dielectric spacers are doped with carbon atoms. The carbon atoms are remotely injected from the one or more dielectric spacers by annealing the substrate, thereby allowing the carbon atoms to diffuse into the etch-stop layer.

In another exemplary embodiment, the present invention is an etch-stop layer comprising a semiconductor substrate having a first surface and a boron layer formed below the first surface of the semiconductor substrate. The boron layer has a full-width half-maximum (FWHM) thickness value of less than 100 nanometers and is formed by a chemical vapor deposition (CVD) system. A germanium profile comprised of germanium atoms is formed substantially within the boron layer and has a germanium fraction of less than one percent to about 20 percent. A carbon profile comprised of carbon atoms is formed substantially within the boron layer and has a concentration within the profile area of between $10^{18}$ and $10^{21}$ atoms per cubic centimeter.

DETAILED DESCRIPTION

Disclosed herein is a fabrication method and a structure resulting therefrom for a boron-doped nanoscale etch-stop. The boron is doped into either a silicon (Si) substrate or film, or a compound semiconductor substrate or film. The compound semiconductor film may be chosen from a Group III-V semiconductor compound such as SiGe, GaAs, or InGaAs. Alternatively, a Group II-VI semiconductor compound may be chosen such as ZnSe, CdSe, or CdTe. The boron-doped nanoscale etch-stop described herein has particular applications in BESOI processing. However, the disclosed boron etch-stop is not limited only to BESOI applications.

A BESOI substrate fabricated in accordance with one exemplary embodiment of the present invention has particular applications in low-power and radiation-hardened CMOS devices. Incorporation of the present invention in various electronic devices simplifies certain fabrication processes, improves scalability of devices, improves sub-threshold slopes, and reduces parasitic capacitances.

As detailed above with reference to the prior art, boron (B) is traditionally provided via ion implantation. However, one problem with boron incorporation by ion implantation is that a resulting boron etch-stop layer is very wide following thermal treatments. The width of the boron layer is due to boron outdiffusion during any thermal treatments performed subsequent to the implant. One subsequent thermal treatment is a high temperature bonding step of the layer transfer process in BESOI processing. The boron outdiffusion is greatly enhanced by transient enhanced diffusion (TED) due to lattice damage and a large presence of silicon interstitial ($S_I$) atoms. The lattice damage and the large number of $S_I$ atoms each contribute to anomalously high quantities of diffusion.

Widths of boron in ion implanted profiles can be greater than 200 nm to 300 nm depending on chosen quantities of ion implant energy and dosage. Typically, high dosage requirements also lead to a great deal of concentration-dependent outdiffusion. Therefore, the transferred silicon device layer thickness can exhibit a very wide thickness range since the etch process itself will have a wide profile range over which to stop on the boron-doped layer. The wide layer range poses significant process integration problems, especially when forming a deep (or even a shallow) trench isolation region.

Formation of Narrow Boron Profile Etch-Stop Regions

An "as grown" boron profile remains very narrow (e.g., less than 100 nm) by forming an ultra-thin (for example, less than 100 nm) boron profile with chemical vapor deposition (CVD) instead of ion implantation and, in some embodiments, by including germanium and carbon. The boron profile in this case remains very narrow even after significant subsequent thermal treatments up to approximately 1000° C. for about 10 seconds or more. Details of exemplary CVD process steps are outlined below.

Silicon interstitial pairing with boron results in a rate of diffusion that is generally much greater than occurs with boron alone. The intrinsic diffusion coefficient ($D_{Si}$) of silicon in silicon is approximately 560 whereas the intrinsic diffusion coefficient of boron ($D_B$) in silicon is approximately 1. Incorporating carbon (C) into boron-doped silicon minimizes a Si—B pair formation and thus reduces an overall rate of boron outdiffusion. In a heterojunction bipolar transistor (HBT), for example, the reduced boron outdiffusion results in less spreading of a p-type SiGe base region. Narrow base widths reduce transit times of minority carriers and improve a device shutoff frequency, $f_t$. Adding carbon and/or germanium, the boron diffusion can be effectively mitigated at temperatures of approximately 1000° C. for 10 seconds or longer.

A device or substrate designer may prefer boron over carbon and/or Ge as a etch-stop depending on device requirements. For example, a design decision may be driven by a preferred majority carrier type and concentration, or a minority carrier type and concentration. One skilled in the art will recognize that adding carbon to a boron-doped layer will diminish carrier mobility. Consequently, more boron is required to compensate for the diminished carrier effect. A skilled artisan will further recognize that the addition of Ge to form a strained lattice in elemental or compound semiconductors enhance in-plane majority carrier hole mobility, but diminishes in-plane majority carrier electron mobility. Therefore, if boron is added to a carbon and/or germanium-doped lattice, the fabrication process must be completely characterized. The process will be a function of gas flows, temperatures, and pressures.

Figure 4:
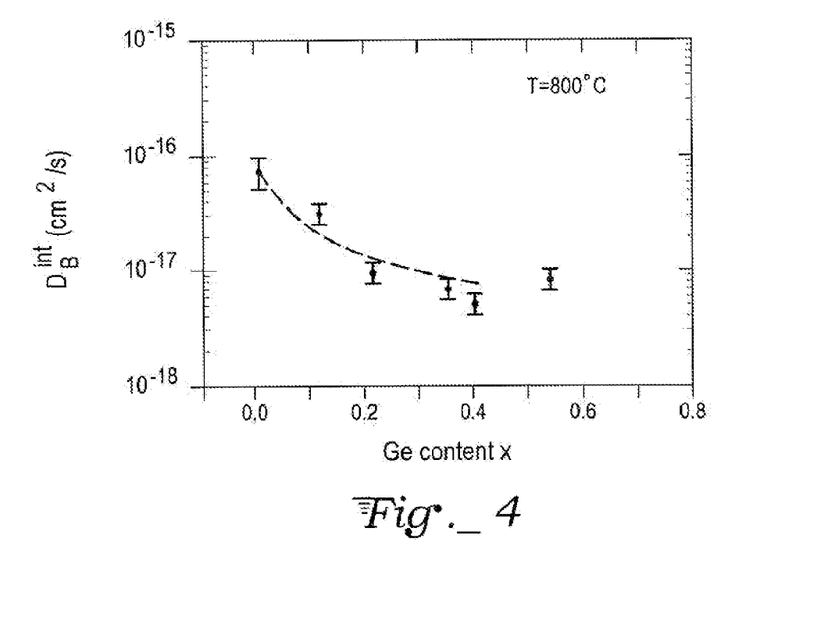
FIG. 4 is a graph indicating a diffusion constant of boron as a function of germanium content at 800° C.

Further, intrinsic diffusivity of boron ($D_B^{int}$), measured in units of an area transfer rate (e.g., $cm^2/sec$), in silicon can be substantial. However, the addition of Ge results in a significant reduction of intrinsic boron diffusivity. (Note: Intrinsic diffusivity of boron refers specifically to the diffusivity of a lone boron atom with no influence from diffusion "enhancing" species such as silicon interstitials as described above.) FIG. 4 indicates measured rates of intrinsic boron diffusivity at 800° C. as a function of Ge content, x, in $Si_{1-x}Ge_x$.

Figure 5:
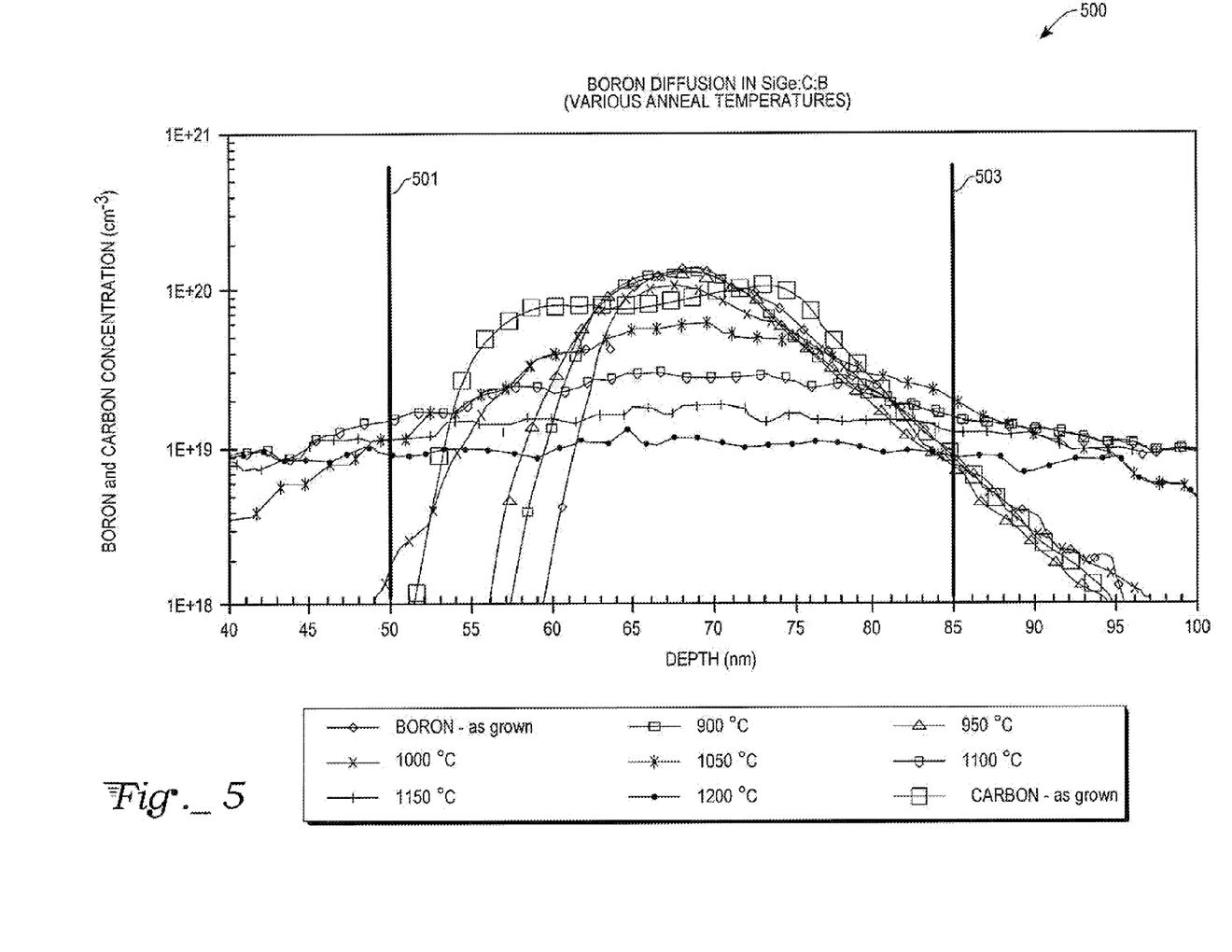
FIG. 5 is a graph indicating full-width half-maximum (FWHM) depth of a boron profile produced in accordance with the present invention and measured after thermal annealing steps.

FIG. 5 is a profile graph 500 representing data from a secondary-ion mass spectrometry (SIMS) profile of boron diffusion in carbon and Ge-doped silicon. A location of the Ge is illustrated by a lower 501 and an upper 503 vertical line positioned at 50 nm and 85 nm depths, respectively. The boron remains relatively fixed up to temperatures of 1000° C., then diffuses rapidly at higher temperatures (anneal times are 10 seconds at each temperature). However, the presence of both carbon and Ge, as introduced under embodiments of the present invention, reduces boron outdiffusion. Depending on concentrations and temperatures involved, the presence of carbon and Ge reduces overall boron diffusion by a factor of ten or more.

Figure 6:
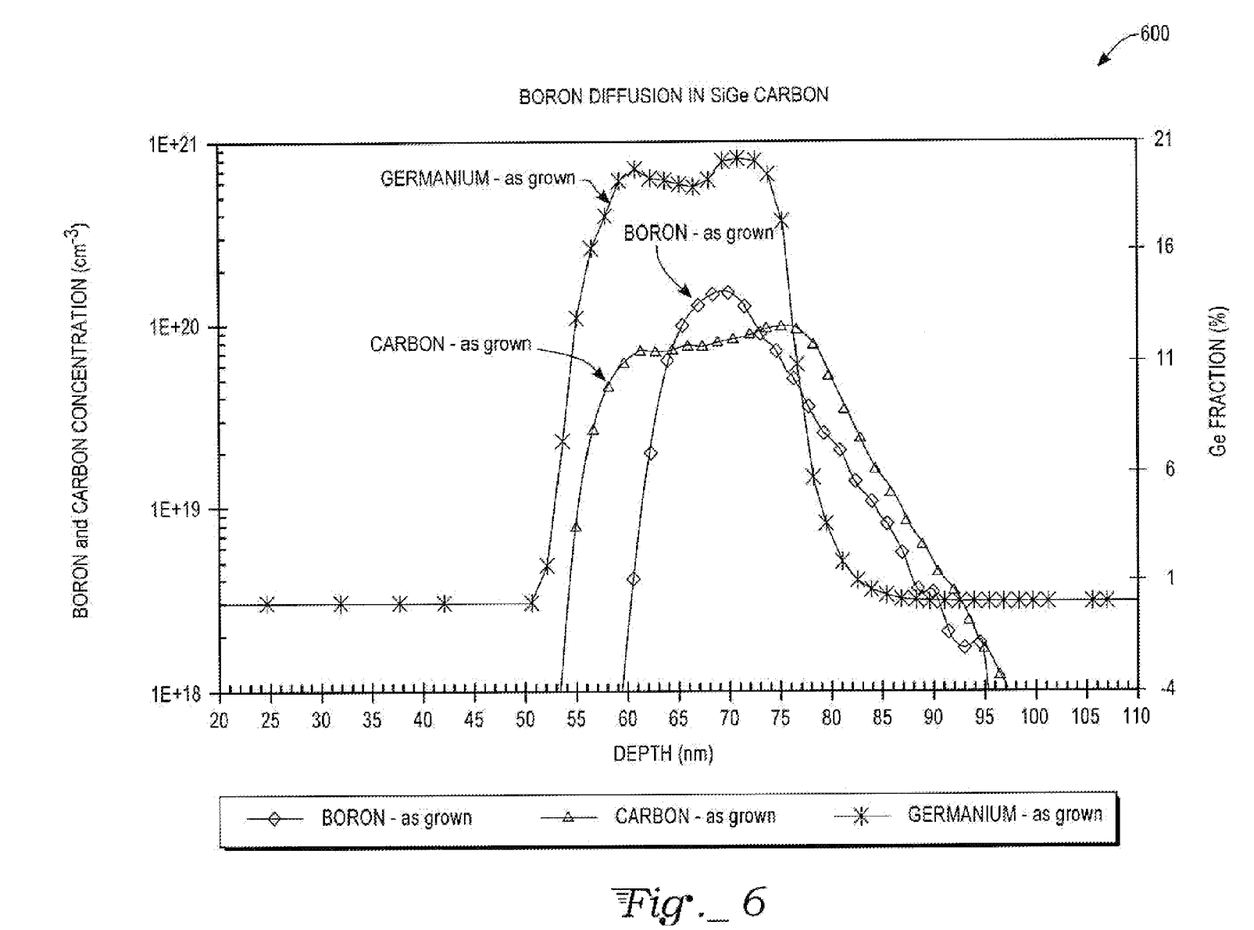
FIG. 6 is a graph indicating boron diffusion depth in SiGe:C:B at various anneal temperatures.

With reference to FIG. 6, a graph 600 indicates boron diffusion depths in SiGe:C:B and a germanium fraction. Boron profiles are displayed in the graph 600 following growth of SiGe:C:B where the subsequent thermal anneals, in this example, relate to bond steps. The graph 600 indicates boron in SiGe with carbon substantially present throughout portions of the structure. Thus, the graph 600 is a complete carbon method for providing a narrow boron profile. A germanium fraction indicates an increased germanium profile substantially within the boron layer. The germanium fraction is within a range from less than one percent to about 20%. As indicated, the profile width for the boron concentration at 1000° C. extends from roughly 62 nm to less than 82 nm. Consequently, the FWHM value is less than about 20 nm. Consequently, the etch-stop is on a nanoscale level. In an exemplary embodiment, the boron etch-stop is formed by chemical vapor deposition (CVD) techniques.

Figure 7:
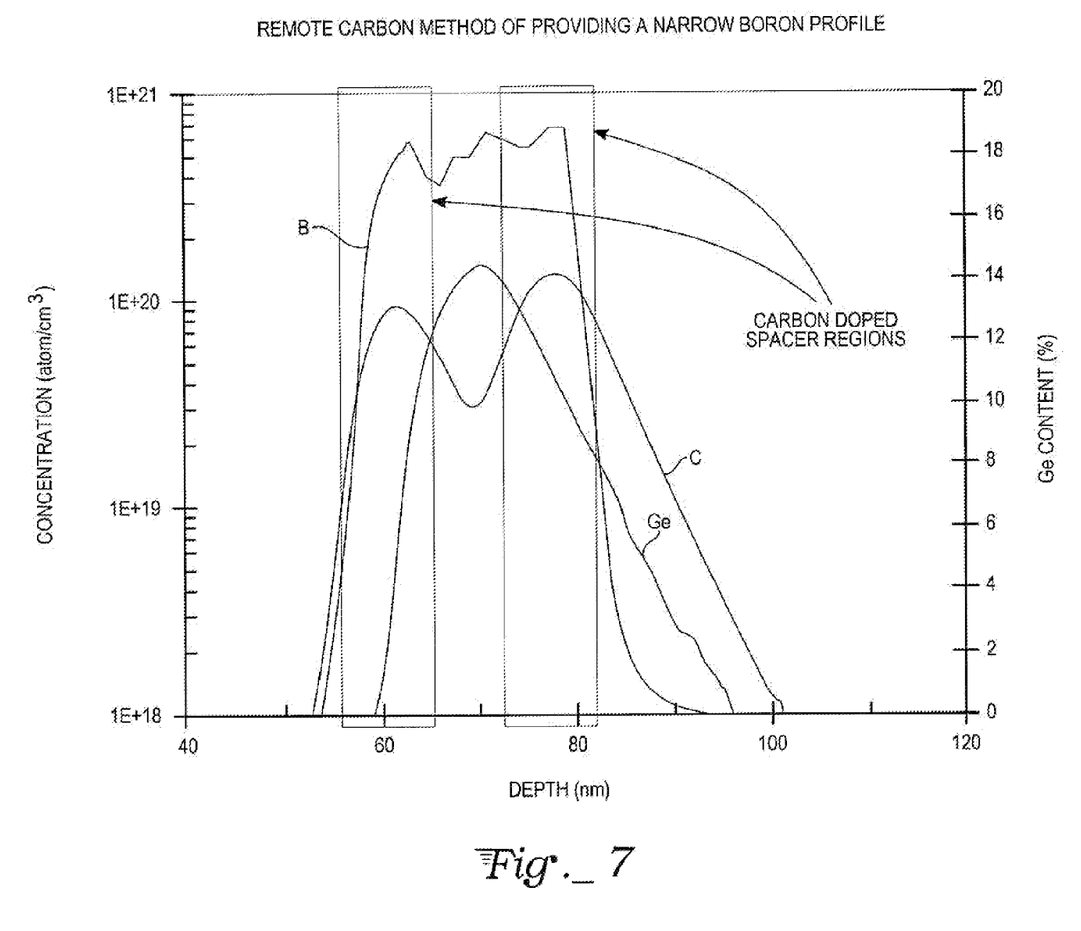
FIG. 7 is a graph indicating boron diffusion profiles and relative depth in a remote carbon method.

FIG. 7 illustrates an embodiment in which profiles of B, C, and Ge are shown with reference to a placement of outer spacers fabricated in a remote carbon injection method. In the remote injection method, carbon is only present in outer spacer regions as indicated. In a specific exemplary embodiment, the spacer regions are comprised of SiGe. A remote carbon technique suitable for adding carbon in various embodiments described herein, is disclosed in U.S. patent application Ser. No. 11/166,287 filed Jun. 23, 2005, entitled "Method for Growth and Optimization of Heterojunction Bipolar Film Stacks by Remote Injection," and commonly assigned, along with this application, to Atmel Corporation, San Jose, Calif. The Ser. No. 11/166,287 application is hereby incorporated by reference in its entirety.

Briefly, the remote carbon injection technique entails a carbon implantation or diffusion step in a semiconductor fabrication process to inject carbon atoms into, for example, a semiconductor device layer and surrounding regions. Alternatively, the carbon implantation or diffusion step may be performed into an insulting layer. The carbon is derived from a carbon precursor such as methyl silane ($CH_3SiH_3$). Carbon precursor injection can be accomplished by techniques such as LPCVD (low pressure chemical vapor deposition), UHCVD (ultra-high vacuum CVD), MBE (molecular beam epitaxy), or ion implantation.

The carbon injection is followed by a thermal anneal step. The thermal anneal step allows the carbon to diffuse into, for example, a base region of a transistor. Note that, even though a carbon precursor may be injected outside of the base region, the position of the carbon after anneal is within the base region due to an energetically favorable diffusion mechanism. Therefore, remote injection is a means of doping a semiconductor with carbon and provides numerous advantages over conventional fabrication methods, discussed above (e.g., preventing boron outdiffusion thus allowing a higher boron-dopant concentration). Therefore, a location of injection and not necessarily a final resting place of carbon following thermal cycles determines a definition of remote carbon injection.

If self-aligning techniques incorporation dielectric spacers are employed, for example, in transistor fabrication, the remote injection can occur during or after growth of a base-emitter spacer (BE) or a base-collector spacer (BC). (Note: formation of neither the BE nor BC spacer are shown but such techniques are well-known in the art). Carbon injection may be performed at multiple points during fabrication of either the base, BC, BE, collector, and/or emitter regions. Thermal anneal cycles are then implemented to provide activation energy for the carbon to diffuse from the dielectric spacer into the one or more various semiconductor regions. A final position of carbon after anneal is within the semiconductor through a diffusion mechanism. Advantages of remote carbon injection thus include a reduced boron outdiffusion and a significant reduction in the transistor base resistance.

A skilled artisan will recognize that many other techniques of fabricating an etch-stop layer, other than remote carbon injection, may be utilized. General techniques for implementing these various techniques are described in detail, below. Various permutations of the general etch-stop fabrication method based on the methods disclosed herein may be employed. For example, a boron etch-stop may be fabricated by in-situ boron doping of silicon by CVD in which the silicon contains neither germanium nor carbon. Additionally, a boron etch-stop may be fabricated by in-situ boron doping of SiGe by CVD in which the SiGe contains no carbon. Further, a boron etch-stop may be fabricated by in-situ boron doping of silicon-carbide (SiC) by CVD in which the SiC contains no germanium. In each of these cases, the boron-doped semiconductor could be implanted by an ion implantation or molecular beam epitaxial (MBE) process. Following any implant step, a flash anneal (e.g., from 900° C. to 1200° C. for 1 second to 5 seconds) or a laser anneal (e.g., less than a one second pulse may be used in order to alleviate any ion implantation damage and still maintain a narrow distribution of boron. If boron is either implanted or diffused, carbon and/or germanium may also be added.

CVD Reactor Fabrication Process

Overall, process conditions can vary widely depending upon particular devices fabricated, specific equipment types employed, and various combinations of starting materials. Also, as is known to a skilled artisan, various dopant profiles may be achieved by certain gases being injected simultaneously and/or ramping the gas flow rates. In a specific exemplary embodiment, the process conditions entail flowing hydrogen ($H_2$) as a carrier gas in a chemical vapor deposition (CVD) system at a flow rate between 5 standard liters per minute (slpm) and 100 slpm. Alternatively, inert gases such as nitrogen ($N_2$), argon (Ar), helium (He), xenon (Xe), and fluorine ($F_2$) are all suitable carrier gases. Silane ($SiH_4$) may be used as a silicon precursor gas, flowing between 5 standard cubic centimeters per minute (sccm) and 1000 sccm. Alternatively, disilane ($Si_2H_6$) or another silicon precursor gas, may be used in place of silane. Disilane deposits silicon at a faster rate and lower temperature than silane.

Diborane ($B_2H_6$) may be used as a boron precursor gas, flowing at between 5 sccm and 1000 sccm. Additionally, boron trichloride ($BCl_3$) or any other boron precursor gas may be used in place of diborane. Methyl silane ($CH_3SiH_3$), or another carbon precursor gas, flowing at between 5 sccm and 1000 sccm may be employed as the carbon precursor. Germanium tetrahydride ($GeH_4$) or another germanium precursor gas flowing at between 5 sccm and 1000 sccm may be employed as the germanium precursor gas.

For a low pressure CVD (LPCVD) reactor, growth temperatures may be in an exemplary range of 550° C. to 750° C. with processing pressures from 1 Torr to 100 Torr.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, although process steps and techniques are shown and described in detail, a skilled artisan will recognize that other techniques and methods may be utilized which are still included within a scope of the appended claims. For example, there are frequently several techniques used for depositing a film layer (e.g., chemical vapor deposition, plasma-enhanced vapor deposition, epitaxy, atomic layer deposition, etc.). Although not all techniques are amendable to all film types described herein, one skilled in the art will recognize that multiple methods for depositing a given layer and/or film type may be used.

Additionally, many industries allied with the semiconductor industry could make use of the remote carbon injection technique. For example, a thin-film head (TFH) process in the data storage industry or an active matrix liquid crystal display (AMLCD) in the flat panel display industry could readily make use of the processes and techniques described herein. The term "semiconductor" should be recognized as including the aforementioned and related industries. The specification and drawings are, accordingly, to be regarded in an illustrative rather than a restrictive sense.

What is claimed is:

1. A method to form an electronic device, the method comprising:
    flowing a boron precursor gas over a substrate in a chemical vapor deposition chamber, the boron precursor gas forming a boron layer thereby acting as an etch-stop layer, the etch-stop layer being formed below a first surface of the substrate, the etch-stop layer being less than 100 nanometers in thickness when measured as a full-width half-maximum (FWIHM) value;
    forming one or more spacers on a surface of the substrate to provide a self-aligning structure;
    doping the one or more spacers with carbon atoms; and
    injecting carbon atoms remotely from the one or more spacers by annealing the substrate thereby allowing the carbon atoms to diffuse into the etch-stop layer.

2. The method of claim 1 wherein the boron layer is less than about 20 nanometers in thickness when measured as a FWHM value.

3. The method of claim 1 wherein the anneal step is performed at 1000° C. for about 10 seconds.

4. The method of claim 1 further comprising:
    flowing a carbon precursor gas over the substrate in the deposition chamber; and
    flowing a germanium precursor gas over the substrate in the deposition chamber so as to limit a diffusivity value of boron atoms within the boron layer.

5. The method of claim 1 wherein the boron precursor gas is diborane flowing at between five standard cubic centimeters per minute (sccm) and 1000 sccm.

6. The method of claim 1 wherein the boron precursor gas is boron trichloride flowing at between five standard cubic centimeters per minute (sccm) and 1000 sccm.

7. The method of claim 1 further comprising flowing a silicon precursor gas over the substrate in the deposition chamber.

8. An etch-stop layer comprising:

a semiconductor substrate having a first surface;

a boron layer formed below the first surface of the semiconductor substrate and having a full-width half-maximum (FWHM) thickness value of less than 100 nanometers, the boron layer being formed by a chemical vapor deposition (CVD) system;

a germanium profile comprised of germanium atoms formed substantially within the boron layer and having a germanium fraction of less than one percent to about 20 percent; and a carbon profile comprised of carbon atoms formed substantially within the boron layer and having a concentration within the profile area of between $10^{18}$ and $10^{21}$ atoms per cubic centimeter.

9. The etch-stop layer of claim 8 wherein the boron layer is less than about 20 nanometers in thickness when measured as a FWHM value.

10. The etch-stop layer of claim 8 wherein the semiconductor substrate is a silicon substrate.

11. The etch-stop layer of claim 8 wherein the semiconductor substrate is an epitaxial silicon film.

12. The etch-stop layer of claim 8 wherein the semiconductor substrate is a deposited silicon film.

13. The etch-stop layer of claim 8 wherein the semiconductor substrate is a silicon-germanium substrate.

14. The etch-stop layer of claim 8 wherein the semiconductor substrate is an epitaxial silicon-germanium film.

15. The etch-stop layer of claim 8 wherein the semiconductor substrate is a silicon-carbide substrate.

16. The etch-stop layer of claim 8 wherein the semiconductor substrate is an epitaxial silicon-carbide film.

17. The etch-stop layer of claim 8 wherein the boron layer is less than about 20 nanometers in thickness when measured as a FWHM value.

* * * * *